(12) United States Patent
Deitch et al.

(10) Patent No.: US 6,428,618 B2
(45) Date of Patent: *Aug. 6, 2002

(54) METHOD FOR FORMING A SOLID SOLUTION ALLOY CRYSTAL

(75) Inventors: Richard H. Deitch, Worthington, OH (US); Thomas G. Digges, Jr., Fredericksburg, VA (US)

(73) Assignee: Virginia Semiconductor, Inc., Fredericksburg, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/780,058

(22) Filed: Feb. 9, 2001

Related U.S. Application Data

(63) Continuation of application No. 09/336,305, filed on Jun. 18, 1999, now Pat. No. 6,251,181.

(51) Int. Cl.⁷ .............................................. C30B 15/20
(52) U.S. Cl. .................... 117/13; 117/2; 117/3; 117/14
(58) Field of Search ............................ 117/2, 3, 13, 14

(56) References Cited

U.S. PATENT DOCUMENTS

| | | | |
|---|---|---|---|
| 5,693,203 A | | 12/1997 | Ohhashi et al. |
| 5,858,086 A | * | 1/1999 | Hunter .................. 117/84 |
| 5,972,109 A | * | 10/1999 | Hunter .................. 117/204 |

FOREIGN PATENT DOCUMENTS

JP  00253830 A  * 10/1996

OTHER PUBLICATIONS

Abrosimov, N.V., "Single Growth of $Si_{1-x}Ge_x$ by the Czochralski Technique." Journal of Crystal Growth, No. 166, pp. 657–662 (1996).

Kimbleton, S.R., et al., "Computer Communication Networks: Approaches, Objectives, and Performance Considerations." Computing Surveys, vol. 7, No. 3, pp. 165–173 (Sep., 1975).

Kurten, M., et al., "Czochralski Growth of $Si_xGe_{1-x}$ Single Crystals." Journal of Crystal Growth, No. 139, pp. 1–5 (1994).

Wollweber, J., et al., "$Si_xGe_{1-x}$ Single Crystals Grown by RF–Heated Float Zone Technique." Journal of Crystal Growth, No. 163, pp. 243–248 (1996).

* cited by examiner

*Primary Examiner*—Felisa Hiteshew
(74) *Attorney, Agent, or Firm*—Fish & Richardson P.C.

(57) ABSTRACT

A method for forming a solid solution alloy crystal includes forming a solid solution alloy crystal having at least the same diameter as a seed crystal. The seed crystal is exposed to a liquid containing a desired concentration of an alloying element to dissolve a portion of the seed crystal. The solid solution alloy crystal is then formed from the liquid. The method allows a large diameter solid solution alloy crystal to be grown in a reduced time or a larger diameter solid solution alloy crystal to be grown in a known fixed total process time.

20 Claims, 4 Drawing Sheets

METHOD FOR FORMING A SOLID SOLUTION ALLOY CRYSTAL

This application is a continuation of U.S. application Ser. No. 09/336,305 filed Jun. 18, 1999 now U.S. Pat. No. 6,251,181. The entire disclosure of such prior application is hereby incorporated by reference.

BACKGROUND OF THE INVENTION

The present invention relates generally to a method for semiconductor wafer manufacturing, and, more particularly, to a method for forming a solid solution alloy crystal.

Silicon is widely used for fabricating semiconductor devices such as integrated circuits, discrete devices, and sensors. In a typical integrated circuit fabrication process, a wafer of crystal material may be exposed to several processing steps such as doping, etching, or implanting to form an array of resulting integrated circuits. The resulting integrated circuits are then individually separated from the wafer and packaged. Typical integrated circuits include several transistors interconnected together.

More recently, the dimensions of semiconductor devices have been reduced such that more devices are formed per unit area on a single wafer. Accordingly, various processes have been developed which permit the forming of larger diameter wafers. This increases the number of circuits which can be placed on an individual wafer. Typically, large diameter wafers can be formed from single crystals that are produced using bulk seeded crystal growing processes to obtain specific crystallographic orientations.

One such technique is the floating-zone ("FZ") process. In this process, a narrow heater, such as a radio frequency single turn coil, surrounds a feed rod of polycrystalline material. The feed rod is positioned above a single seed crystal that has a desired crystallographic orientation. The heater melts the feed rod material to create a liquid of material from which a resulting single crystal is grown. A floating liquid zone is created, when the melted material contacts the single seed crystal. The feed rod polycrystalline material is then continuously converted into single crystal. The term single crystal refers to a crystal that is in the form of a monocrystalline material.

A single crystal can be doped by solid or gaseous sources during the growth process. The gaseous dopants may be diluted into an inert carrier gas and blown to the floating zone of the liquid silicon. The solid dopants may be incorporated into the feed rod. The dopants are dissolved into the liquid and then incorporated into the growing crystal.

One disadvantage to the FZ process is that solid alloy material, which may be used to increase the performance of the resulting circuit, may not be able to be added without disturbing the liquid zone. Thus, the resulting single crystal may only be used in a limited number of semiconductor applications.

Another known bulk crystal growing process is the Bridgman method. A closed tube configuration is employed in which a seed is placed at one end of the tube in a liquid. The liquid is cooled to cause the liquid to solidify as a single crystal. The resulting single crystal has a specific crystallographic orientation. One disadvantage to this technique is that unwanted stresses typically occur in the resulting single crystal.

Another known technique is the Czochralski ("CZ") or crystal pulling method. A seed attached to a shaft is lowered into a liquid pool. The shaft is then simultaneously rotated and raised (pulled) in a continuing sequence of precisely controlled steps. As the shaft is raised, crystallization occurs where the liquid contacts the seed to form a single crystal. The resulting single crystal is then sliced in a sawing process to produce individual wafers. Typically, a wafer may have a resulting diameter between 80–90% of the original diameter of the grown single crystal. This is because the crystal may be ground, lapped, and polished before the wafers are formed. Using known CZ methods, a single crystal having a length of about one meter and a diameter of about 80 mm may take a day or more to produce.

Known CZ methods are adequate for single crystal growth, when the single crystal is formed from one chemical element or a compound. However, the growth of solid solution alloy crystals requires specific processing steps that increase the complexity of the growing process. In particular, an alloy crystal requires substantially lower growth rates, and therefore more processing time, to maintain suitable crystal growth. This is necessary to prevent the alloy crystal from degrading into a dendritic or polycrystalline form. For example, a processing step may take about forty times longer for an alloy crystal compared to an elemental or compound single crystal. However, in known CZ methods, the total processing time is fixed. As a result, both the length and diameter of a resulting alloy crystal is significantly limited.

SUMMARY OF THE INVENTION

The present inventors have discovered a method for growing large diameter solid solution alloy crystals. In accordance with one aspect of the invention, this is done by forming a solid solution alloy crystal having a diameter that varies with a diameter of a seed crystal. The seed crystal is exposed to a liquid including a concentration of at least one alloy element to dissolve a portion of the seed crystal. The solid solution alloy crystal may then be formed from the liquid. Because the seed crystal has a diameter at least the same as the resulting alloy crystal, the preferred method can be used to grow a larger diameter solid solution alloy crystal in a fixed total process time, as compared to known systems. Alternatively, a large diameter solid solution alloy crystal can be formed in a shorter process time in accordance with the preferred method.

Preferably, the seed crystal may be formed from a Czochralski process, or may be a portion of a prior grown crystal. The solid solution alloy crystal may be formed from a combination of germanium and silicon.

In accordance with another aspect, the invention is directed to a method for forming a semiconductor wafer that includes forming a solid solution alloy crystal having a diameter that varies with a diameter of a seed crystal. The seed crystal may be exposed to a liquid to dissolve a portion of the seed crystal, and the liquid may have a concentration including at least one alloy element. The solid solution alloy crystal may be formed from the liquid. A plurality of wafers may then be formed from the grown solid solution alloy crystal. An internal diameter saw may be used to form the wafers from the solid solution alloy crystal.

These and other embodiments, aspects and advantages of the invention will become more apparent in light of the following detailed description, including the accompanying drawings and appended claims.

The details of one or more embodiments of the invention are set forth in the accompanying drawings and the description below. Other features, objects, and advantages of the invention will be apparent from the description and drawings, and from the claims.

DESCRIPTION OF THE PREFERRED EMBODIMENTS

A solid solution alloy crystal may be formed using a known Czochralski process. A solid mixture including an alloy material is placed in a crucible and exposed to suitable heat to melt the mixture to form a liquid. A seed is rotatably attached to an elongated member and immersed partially into the liquid. Next, the seed is slowly pulled from the liquid while the seed is rotated at a predetermined speed, such as 5–15 rpm. The liquid hardens around the seed to form the resulting alloy crystal as follows.

The diameter of the alloy crystal is initially expanded by decreasing the pull rate for a predetermined processing time. For example, the pull rate may be decreased to less than 1 mm/hr. Next, the alloy crystal is grown at a constant pull rate to provide a substantially constant diameter body. Finally, the alloy crystal is detached from the liquid. The alloy crystal is then cooled for two hours or more before removing the crystal and forming wafers.

The total process time to form an alloy crystal is limited by dissolution of the crucible and oxidation within the chamber in the above Czochralski process. For example, the total process time may be limited to about three days. However, certain processing steps may require about a day or more to complete. Thus, the diameter and length of the body of the resulting alloy crystal is limited. Additionally, a polycrystalline layer may form at the periphery of the seed crystal that further limits the diameter and length of the alloy crystal.

Accordingly, the inventors have discovered that a solid solution alloy crystal may be formed in a two stage growing process. The process forms a large diameter alloy crystal in a significantly reduced process time, as compared to known methods. For example, the process time may be reduced by fifty percent. Alternatively, the alloy crystal may be expanded to a larger diameter in the above fixed total process time, as compared to known processes.

In the first stage, a seed crystal is formed having a diameter slightly greater than that of the resulting alloy crystal. The seed crystal may be formed from a Czochralski process. Alternatively, the seed crystal may be formed from a prior grown crystal, for example, a previously grown silicon crystal, solid solution alloy crystal, or any other suitable crystal for semiconductor fabrication. In the second stage, the seed crystal is exposed to a liquid containing a concentration of silicon and an alloying material, until a portion of the seed crystal dissolves in the liquid. An alloy crystal is then grown having a suitable solid solution alloy crystal composition. The alloy crystal may be a silicon-germanium crystal, doped silicon-germanium crystal, a single crystal or other suitable solid solution alloy crystal for semiconductor fabrication.

Figure 1:
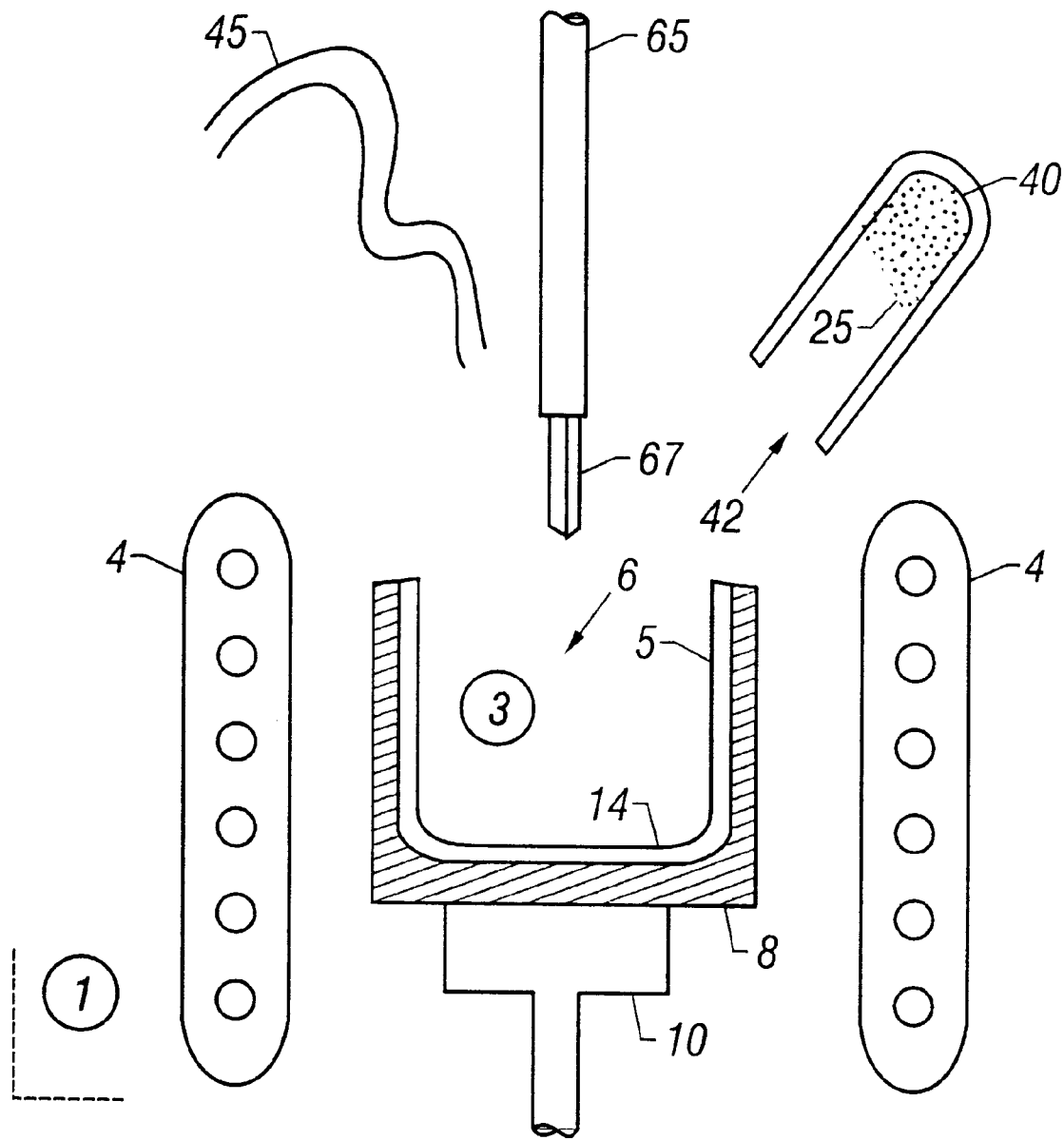
FIG. 1 illustrates an exemplary Czochralski apparatus for forming a solid solution alloy crystal in accordance with a preferred method.

FIG. 1 shows an exemplary Czochralski ("CZ") growing apparatus 1 which may be employed to form a solid solution alloy crystal in accordance with a preferred method. The CZ apparatus 1 includes a crucible 3 disposed in a chamber (not shown) having an elongated cylindrical body 5 and an opening 6 at its upper end. The crucible 3 may be formed from fused-silica, quartz, or other suitable material. A susceptor 8 may be configured inside the chamber to support the crucible 3. The susceptor 8 may be formed from, for example, graphite. A heater 4 is positioned around a portion of susceptor 8 to supply suitable heat to the interior of crucible 3 during operation. Heater 4 may be, for example, an electrical resistance heater or inductive coil.

The CZ apparatus 1 also includes a rotating support member 10. The rotating member 10 engages the lower portion of the susceptor 8 to rotate the susceptor 8 and the crucible 3 in a clockwise or counterclockwise direction during the crystal growing process, as described below. The rotating member 10 may be driven by, for example, a motor (not shown). Suitable speeds for the rotating member 10 may be about 1–30 rpm.

A dispenser 40 may be positioned above the opening 6 of the crucible 3 to supply a sufficient amount of powdered or granulated material 25 through opening 42 to the crucible 3. Material 25 may be silicon, germanium, or other alloying or doping material. More than one dispenser 40 may be used to supply individual materials to the interior of crucible 3. The dispenser 40 may be formed from quartz or other suitable material. The dispenser 40 may be rotated by, for example, a motor.

The CZ apparatus 1 also includes a pull shaft 65 disposed above the crucible 3 for holding a seed 67 made from, for example, silicon, on its lower end. The pull shaft 65 may concurrently rotate and vertically move the seed 67 during the crystal growing process.

One or more gas lines 45 may positioned above the opening 6 of the crucible 3 to supply dopant or inert gases to the interior of the crucible 3 at predetermined times. The gases may be employed to remove reaction products from the chamber. Additionally, the gases may be employed to maintain a suitable atmosphere within the chamber.

Figure 2A:
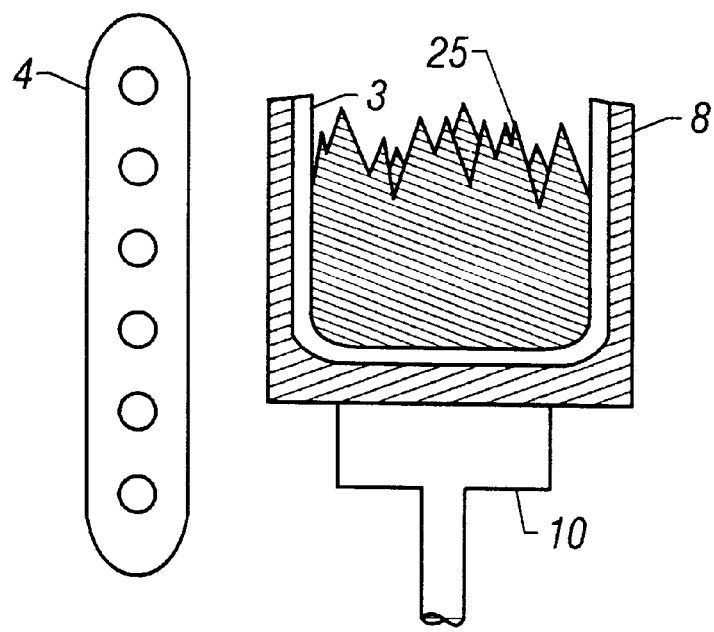
FIGS. 2A–2B illustrate a liquid formed in the Czochralski apparatus of FIG. 1.
Figure 2B:
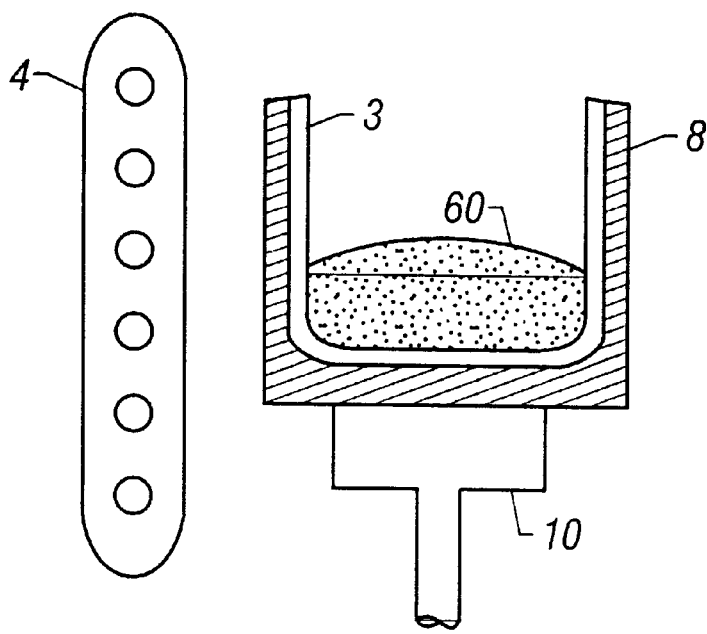

FIG. 2B illustrates a liquid 60 formed inside crucible 3 during the seed crystal growing process. Liquid 60 may fill about 30% of crucible 3. To form liquid 60, granulated silicon from dispenser 40 or solid pieces of silicon 25 may be added to crucible 3 (FIG. 2A). Next, the heater 4 supplies heat to the exterior of the susceptor 8 to melt the silicon to form the liquid 60.

As described above, the seed crystal may be formed from a portion of a previously grown crystal. The previously grown crystal may be a single crystal or a previously grown solid solution alloy crystal. The seed crystal may also be grown using the exemplary CZ apparatus 1 as follows.

Figure 3A:
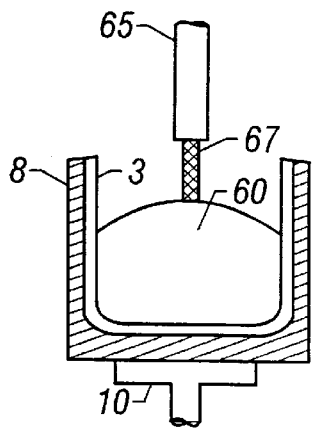
FIGS. 3A–3G illustrate various stages of the formation of a seed crystal.
Figure 3B:
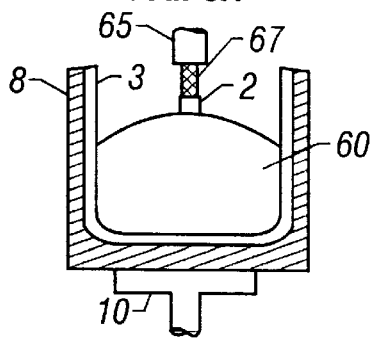

FIG. 3A illustrates a lower end of a seed 67 is partially immersed into the liquid 60 by the pull shaft 65. Preferably, seed 67 has a smaller diameter than the seed crystal 92 (FIG. 3G). Next, the pull shaft 65 is pulled upward to form a short length crystal 2 from seed 67 (FIG. 3B). The short length crystal 2 is formed to provide a starting point for the growth process of seed crystal 92. Pull shaft 65 may rotate seed 67. Additionally, support member 10 may rotate susceptor 8 and, thus, crucible 3 in a direction opposite of seed 67.

Figure 3C:
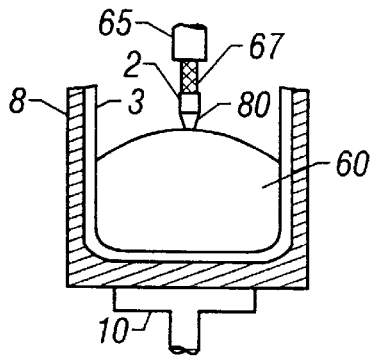

FIG. 3C illustrates a neck 80 formed from short length crystal 2. The neck 80 may have a diameter of about 4 mm. This process may occur during the pulling of seed 67 from liquid 60 to remove dislocations from the crystal material. Preferably, the number of dislocations is substantially zero. The term "dislocations" generally refers to a defect in the structure of the crystal. At this stage, the temperature of liquid 60 is preferably greater than 1412□ C., which is the melting point of silicon. The seed 67 may rotate at a speed of 10 rpm, and the pull shaft 65 may lift seed 67 from liquid pool 60 at about 20 cm/hr.

Figure 3D:
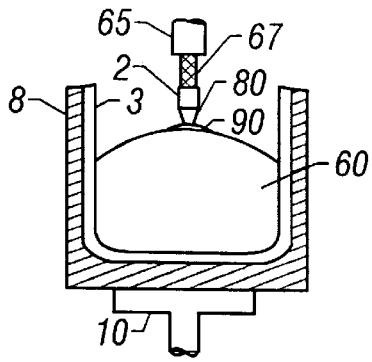
Figure 3E:
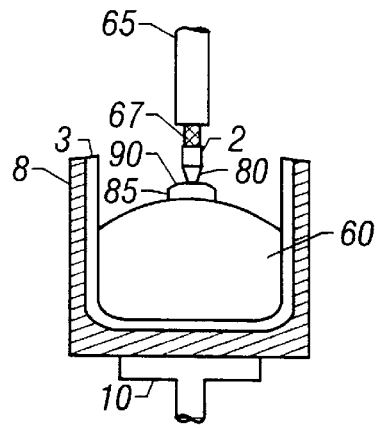

As shown in FIG. 3D, a cap 90 may be formed below neck 80. The seed 67 may be pulled upward by pull shaft 65 at a rate of about 25 mm/hr, and the cap 90 may have a resulting diameter of about 65 mm. A shoulder 85 is then formed contiguous with cap 90 by increasing the pull rate to about 12 cm/hr. (FIG. 3E)

Figure 3F:
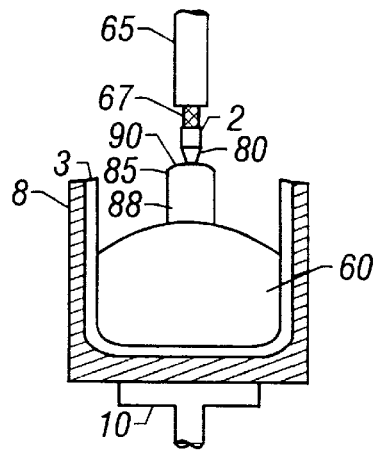
Figure 3G:
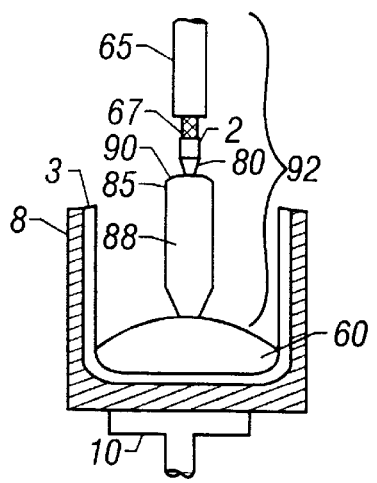

FIG. 3F shows a body 88 is formed below shoulder 85. The body 88 is grown to a diameter substantially the same as the resulting alloy crystal (FIG. 4B). The diameter of body 88 may be about 65 mm. The body 88 may be truncated, as shown in FIG. 3G. The body 88 may have a larger or smaller diameter than shoulder 85. The body 88 of the resulting seed crystal 92 may then be shaped or patterned by grinding or etching. More than one seed crystal 92 may be formed in a single batch crystal growing process.

Figure 4A:
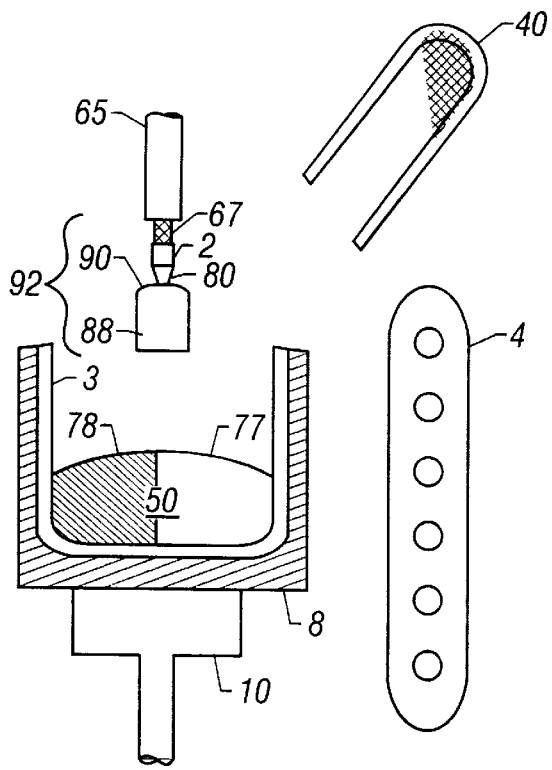
FIGS. 4A–4B illustrate various stages of the formation of a solid solution alloy crystal in accordance with the preferred method.
Figure 4B:
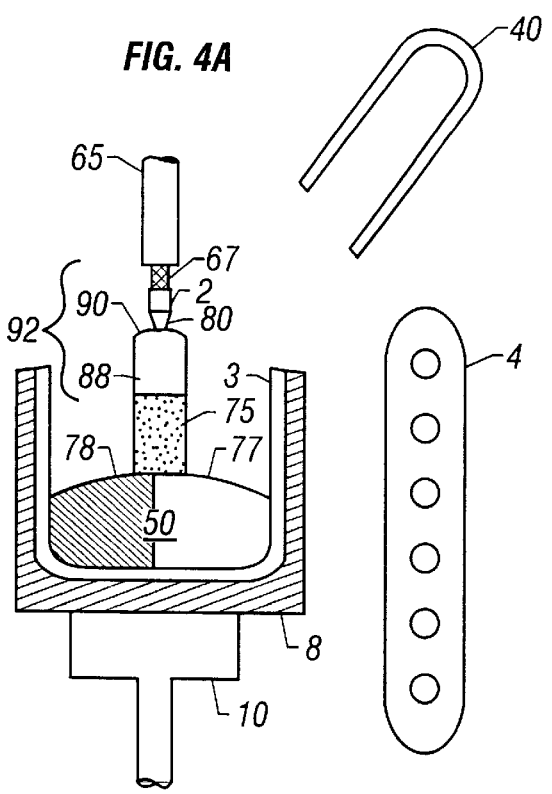

FIG. 4A illustrates seed crystal 92 is exposed to a liquid 50. Liquid 50 is formed from a concentration of silicon 77 and an alloying material 78. Liquid pool 50 may be formed by adding specific amounts of alloy material 78 from dispenser 40, and then exposing the material to heater 4, as described above. Alternatively, the alloy material 78 and material 25 may be added to and heated in crucible 3 concurrently. The concentration of alloy material 78 may be greater than zero and less than 100 weight percent. For example, to grow a seed crystal having a forty weight percent concentration of germanium, the liquid 50 may have a concentration of about seventy weight percent germanium. Material 78 may also include a doping material, for example, boron. Seed crystal 92 contacts liquid 50 such that a sufficient amount of dissolution of body 88 occurs.

As shown in FIG. 4B, a solid solution alloy crystal 75 may then be formed. The solid solution alloy crystal 75 may have a diameter substantially the same or less than body 88. The alloy crystal 75 may then be sliced into wafers by, for example, an internal diameter saw.

An example growth of an alloy crystal 75 in accordance with the preferred method is as follows. Using inductive heating, a seven inch diameter crucible is filled with pre-weighed silicon and germanium to produce a total charge of 1500 grams. Under a helium flow sufficient to maintain one atmosphere pressure in the growth chamber, the charge is heated to form a liquid. A seed crystal having a diameter of about 65 mm is exposed to the liquid to partially dissolve the seed crystal. The seed crystal then is rotated at about 10 rpm in a clockwise direction, and the crucible is rotated in a counter clockwise direction at the same rate. Concurrently, the seed crystal is pulled upward from the liquid at about 1 mm/hr. The temperature is also decreased at a rate sufficient to maintain the alloy crystal diameter at least at 50 mm.

As described above, the diameter of the seed crystal 92 should be at least substantially the same diameter as that of the resulting alloy crystal 75. Further, growing the alloy crystal 75 from a previously grown seed crystal 92 may reduce the total process time. Alternatively, an alloy crystal 75 having an increased length may be grown for the same total process time (e.g., three days). Accordingly, larger diameter alloy crystals 75 may be grown than in known systems. The present inventors have also discovered that minimizing the number of dislocations in the seed crystal produces a solid solution alloy crystal with a low dislocation density. Accordingly, the number of structural defects in the resulting wafer may be minimized. Additionally, the alloy crystal 75 may be grown in the same batch process as the seed crystal 92. This means that less material may be used to grow large diameter alloy crystals 75.

The present disclosure has been described in terms of a number of embodiments. The invention, however, is not limited to the embodiments depicted and described. For example, the crystal growth process may be varied to achieve polycrystalline growth. Additionally, the diameter of the solid solution alloy crystal may be increased using a larger diameter seed crystal.

What is claimed is:

1. A method, comprising:
    providing a seed crystal having a first diameter at least as great as a solid solution alloy crystal to be formed; and
    forming the solid solution alloy crystal from a liquid, the liquid having a concentration including at least one alloy element.

2. The method of claim 1, wherein the diameter of the solid solution alloy crystal increases with an increase of the first diameter.

3. The method of claim 1, wherein the providing a seed crystal further comprises forming the seed crystal from a Czochralski process.

4. The method of claim 1, wherein the providing seed crystal further comprises forming the seed crystal from a portion of a prior grown crystal.

5. The method of claim 1, wherein the solid solution alloy crystal is formed form a combination of germanium and silicon.

6. The method of claim 1, wherein the seed crystal is formed from silicon.

7. The method of claim 1, wherein the providing the seed crystal further comprises removing a plurality of dislocations from the seed crystal.

8. The method of claim 1 wherein the solid solution alloy crystal comprises a concentration of alloy material less than 100 weight percent.

9. The method of claim 1, wherein the solid solution alloy crystal is a single crystal.

10. The method of claim 1, wherein the providing the seed crystal further comprises doping the solid solution alloy crystal.

11. The method of claim 1, wherein the providing the seed crystal further comprises one of patterning and shaping the seed crystal.

12. The method of claim 1 further comprising forming a plurality of wafers from the solid solution alloy crystal.

13. The method of claim 1 wherein the forming the solid solution alloy crystal further comprises varying a diameter of the solid solution alloy crystal with the first diameter of the seed crystal.

14. A method, comprising:
    providing a seed crystal having a first diameter at least as great as a solid solution alloy crystal to be formed;
    exposing the seed crystal to a liquid, the liquid having a concentration including at least one alloy element; and
    forming the solid solution alloy crystal from the liquid, the solid solution alloy crystal having a diameter that varies with the first diameter.

15. The method of claim 14, wherein the providing a seed crystal further comprises forming the seed crystal from a Czochralski process.

16. The method of claim 14, wherein the providing seed crystal further comprises forming the seed crystal from a portion of a prior grown crystal.

17. A method, comprising:

providing a seed crystal having a first diameter at least as great as a solid solution alloy crystal to be formed, exposing the seed crystal to a liquid, the liquid having a concentration including at least one alloy element and silicon; and forming the solid solution alloy crystal from the liquid, the solid solution alloy crystal having a diameter that varies with the first diameter.

18. The method of claim 17, wherein the providing the seed crystal further comprises removing a plurality of dislocations from the seed crystal.

19. The method of claim 17, wherein the solid solution alloy crystal comprises a concentration of alloy material less than 100 weight percent.

20. The method of claim 17, wherein the solid solution alloy crystal is a single crystal.

* * * * *